(12) United States Patent
Seguido et al.

(10) Patent No.: US 9,258,890 B2
(45) Date of Patent: Feb. 9, 2016

(54) SUPPORT STRUCTURE FOR STACKED INTEGRATED CIRCUIT DIES

(71) Applicant: STMicroelectronics, Inc., Calamba, Laguna (PH)

(72) Inventors: Rammil Seguido, Malolos (PH); Frederick Ray Gomez, Quezon (PH); Emmanuel Angeles, Bacoor (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 14/294,875

(22) Filed: Jun. 3, 2014

(65) Prior Publication Data
US 2015/0351234 A1    Dec. 3, 2015

(51) Int. Cl.
*H01L 23/52* (2006.01)
*H01L 23/48* (2006.01)
*H05K 1/02* (2006.01)
*H05K 3/30* (2006.01)
*H05K 1/18* (2006.01)
*H05K 1/11* (2006.01)

(52) U.S. Cl.
CPC ............. *H05K 1/0296* (2013.01); *H05K 1/111* (2013.01); *H05K 1/181* (2013.01); *H05K 3/305* (2013.01); *H05K 2201/09236* (2013.01); *H05K 2201/10378* (2013.01); *H05K 2201/10515* (2013.01); *H05K 2201/10719* (2013.01); *H05K 2201/10977* (2013.01); *H05K 2203/049* (2013.01); *Y10T 29/49146* (2015.01)

(58) Field of Classification Search
CPC .............. H01L 25/0652; H01L 25/074; H01L 23/5384; H01L 21/486; H01L 25/043
USPC ............................ 257/686, 723, 777; 438/109
See application file for complete search history.

(56) References Cited

U.S. PATENT DOCUMENTS

| | | | |
|---|---|---|---|
| 5,442,230 A * | 8/1995 | Chillara et al. | 257/666 |
| 7,616,451 B2 | 11/2009 | Ziglioli et al. | |
| 8,058,715 B1 * | 11/2011 | Roa et al. | 257/686 |
| 8,411,457 B2 | 4/2013 | Ziglioli et al. | |
| 2013/0170166 A1 | 7/2013 | Ziglioli et al. | |

* cited by examiner

*Primary Examiner* — Theresa T Doan
(74) *Attorney, Agent, or Firm* — Seed IP Law Group PLLC

(57) ABSTRACT

Delamination of stacked integrated circuit die configurations on printed circuit boards is avoided by providing a metal trace support structure underneath the die stack. The metal trace support structure features substantially equally spaced thin metal traces in place of a contiguous metal plate which has been used in the past. Spaced apart thin metal traces are less vulnerable to thermal expansion than a metal plate which has a large thermal mass. The metal traces still provide structural stability, while preventing delamination of the die stack configuration during thermal processing. A method of attaching a bridge die stack configuration to a printed circuit board by adhering a die attach film to a field of metal traces is demonstrated. In addition, the electrical and structural integrity of the bridge die stack formed with a metal trace support structure is confirmed with test results.

14 Claims, 11 Drawing Sheets

SUPPORT STRUCTURE FOR STACKED INTEGRATED CIRCUIT DIES

BACKGROUND

1. Technical Field

The present disclosure generally relates to integrated circuit die packaging, and in particular, to packaging multiple semiconductor dice in a stacked configuration.

2. Description of the Related Art

A trend in microelectronics packaging of integrated circuit (IC) chips is reduction of the electronic package dimensions—both the package footprint and the package thickness—while continuing to provide greater functionality. To address the need for size reduction, it is now customary to attach layered stacks of multiple IC chips, also called dies or dice, to printed circuit boards (PCBs). The chips may be stacked, for example, in a pyramidal configuration.

The stacked chips are secured physically to one another, and are surface-mounted to the PCB by an adhesive die attach film (DAF). Electrical connections between the PCB and a chip at the base of the stack are made by forming a two-dimensional array of solder balls, or ball grid array (BGA), on the underside of the base chip. The solder ball array is then placed in contact with metal interconnects patterned on a top metal layer of the PCB. Alternatively, an array of contact pads, such as a land grid array (LGA) or an ultra-fine land grid array (uFLGA) can be used instead of a BGA. Direct electrical connections between dice in a stacked configuration can be made using wire bonds. Additional wire bonds can be used to couple the layered stacks to one another via interconnects formed in the top metal layer.

PCBs bearing stacked chips can then be installed in, for example, mobile electronic devices such as smart phones, tablet computers, global positioning system (GPS) mapping devices, digital cameras, and the like. Each generation of mobile devices demands smaller and thinner electronic packages, while providing more functions to consumers. Enhanced functionality requires more complex integrated circuits, and more dice stacked into the electronic package. Semiconductor packages that accommodate stacked die configurations are described in further detail in U.S. Pat. Nos. 7,616,451 and 8,411,457, and in U.S. Patent Application Publication No. US2013/0170166 to Ziglioli et al., and assigned to the same assignee as the present patent application.

BRIEF SUMMARY

One problem that can occur when stacking integrated circuit chips on a printed circuit board is that exposure to high temperatures during the die attach process can cause expansion of the top metal layer of the printed circuit board. Such expansion can create a fulcrum that exerts an upward force on the die stack, causing voids to form in the die attach film. Subsequent delamination of the stacked dice at the die attach film interface can cause catastrophic reliability failure of the package. A die stack in the form of a bridge is particularly vulnerable to such a failure mode, as compared to, for example, a typical pyramidal die stack. However, some die size combinations will not stack into a pyramid, and therefore use of an alternative stacked arrangement of dice, such as a bridge configuration, is preferred. The present inventors have recognized that when the top metal layer of the printed circuit board includes equally spaced, thin metal traces instead of a contiguous metal plate, the metal layer becomes less vulnerable to thermal expansion, and thus delamination of the die stack is prevented.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of attaching chips to printed circuit boards, comprising embodiments of the subject matter disclosed herein, have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Specific embodiments are described herein with reference to stacked die arrangements that have been produced; however, the present disclosure and the reference to certain materials, dimensions, and the details and ordering of processing steps are exemplary and should not be limited to those shown. The terms "dies" and "dice" are used interchangeably to refer to a plurality of integrated circuit chips of various types singulated from semiconductor wafers.

Figure 1:
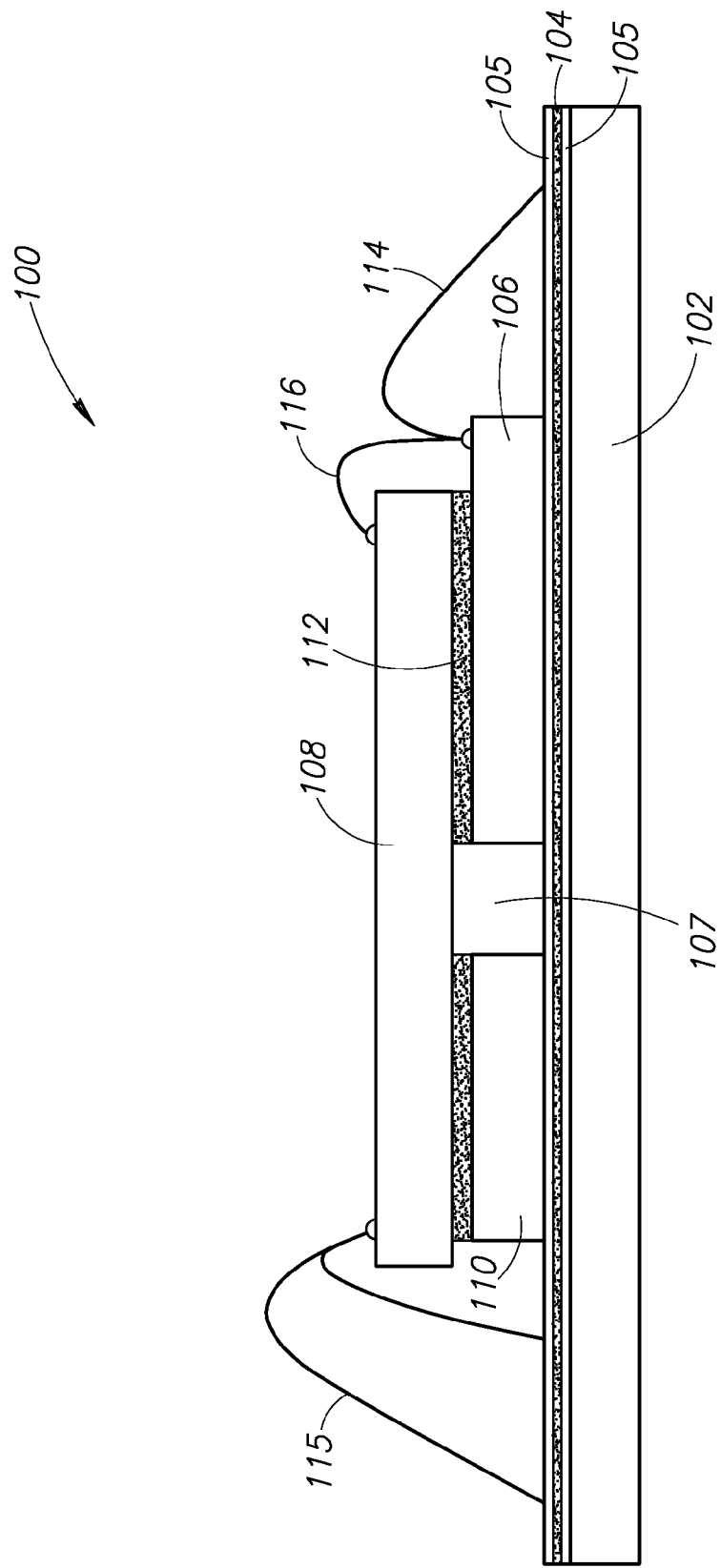
FIG. 1 is a side view of a bridge die stack configuration according to one embodiment described herein.

FIG. 1 shows a bridge die stack 100 on a substrate 102, according to one embodiment. The substrate 102 is a printed circuit board (PCB) made of a polymeric resin material. The substrate 102 is fabricated with an embedded metal interconnect structure 104 that typically includes two to four metal interconnect layers vertically coupled by vias, and sandwiched between insulating solder mask layers 105. The embedded metal interconnect structure 104 of the PCB provides signal wiring for coupling components of the bridge die stack 100 to one another and to other dice mounted on the substrate 102.

Components of the bridge die stack 100 include different types of integrated circuit dies such as, for example, a power package that includes a high-frequency digital die 106, a DC or low-frequency analog die 108, and an interposer 110, which is a fake die, or a dummy, used as a support. The bridge die stack 100 is arranged on top of base chips, e.g., 106 and 110, so as to bridge a gap 107. An adhesive die attach film (DAF) 112 is shown between the layers of the bridge die stack 100. Bond wires 114, 115, and 116 electrically couple the microelectronic dice to one another. Some bond wires, e.g., 116, directly couple vertically adjacent dies 106 and 108, while other bond wires, e.g., 114, 115, couple dies indirectly via the internal metal interconnect structure 104 in the PCB.

Figure 2A:
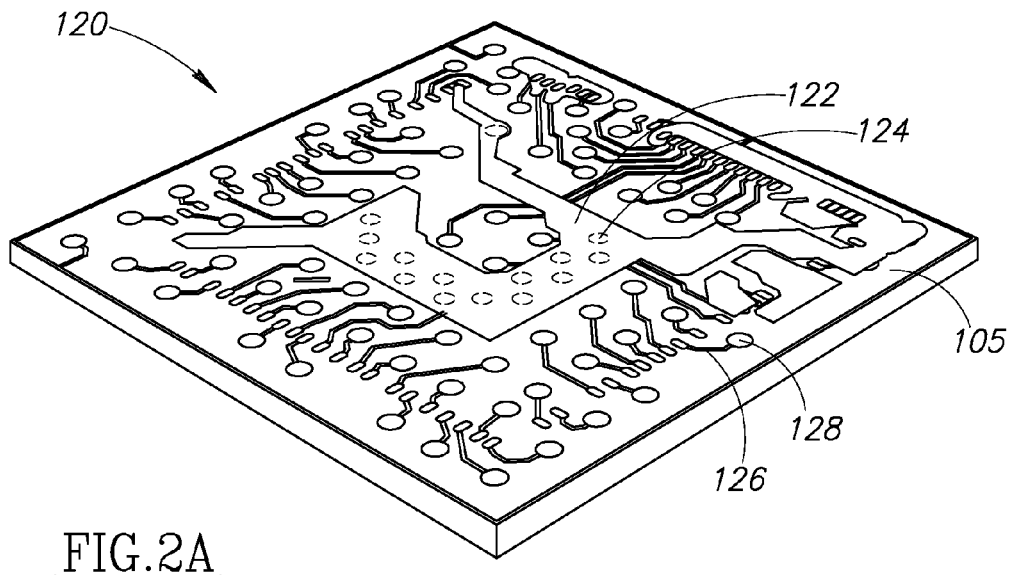
FIG. 2A is a pictorial perspective view of a prior art PCB in which the top metal layer includes a metal plate for structural support of a die stack, surrounded by electrical contact pads and trace wiring.
Figure 2B:
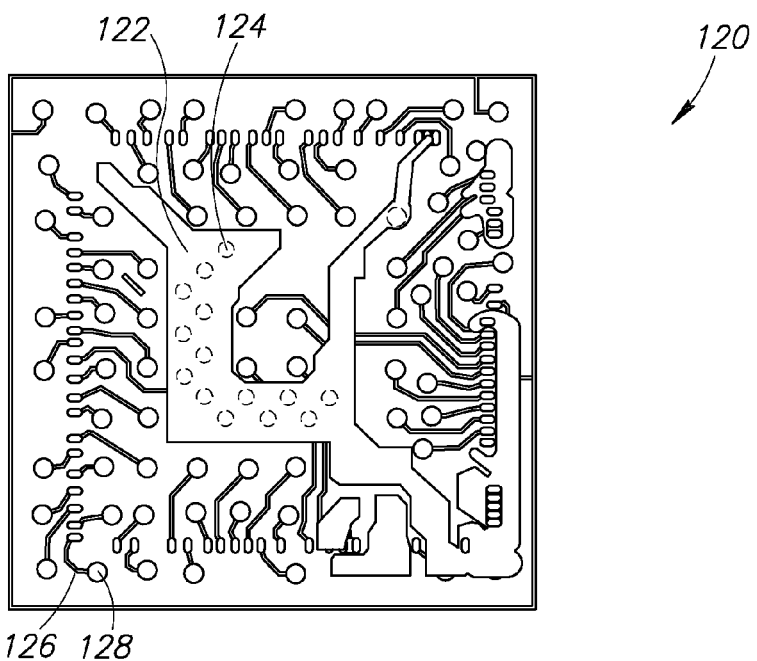
FIG. 2B shows a top plan view of the prior art PCB shown in FIG. 2A.

FIGS. 2A and 2B show a perspective view and a top plan view, respectively, of a typical top metal layer 120 of a PCB, according to the prior art. The top metal layer 120 is designed to provide structural support for the bridge die stack 100 and signal paths that connect the components therein. The top metal layer 120 is often made of copper, but it can be made of any suitable conducting material. The top metal layer 120 includes various patterned features such as, for example, a central metal plate 122 and peripheral individual trace features 126 having rounded ends that provide contact pads 128 for elements of a BGA or an LGA. The central metal plate 122 can be a solid metal pad. Alternatively, the central metal plate 122 can have cutouts 124 arranged, for example, in a regular mesh pattern as shown, wherein the mesh elements have a center-to-center dimension within the range of about 300-500 μm. The metal plate 122 provides structural support for the die stack. The purpose of the metal plate 122 is not to provide electrical connections to, or among, the dies.

Figure 3A:
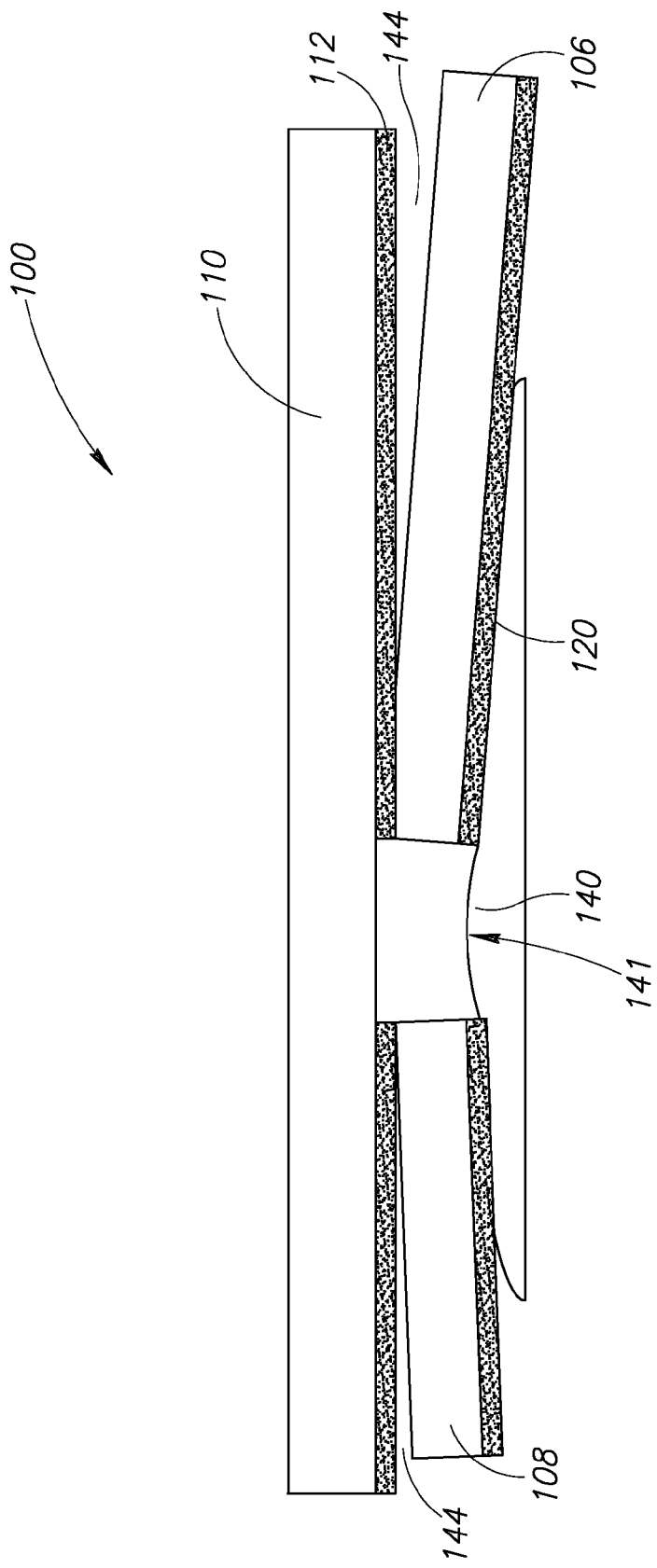
FIG. 3A is a pictorial view of a prior art bridge die stack that has failed during thermal processing.
Figure 3B:
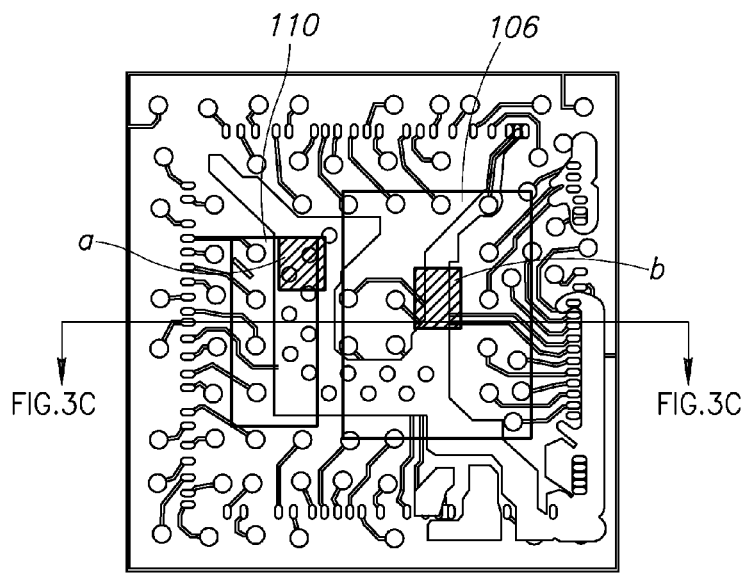
FIG. 3B is a top plan view of the top metal layer of the PCB to which the failed bridge die stack depicted in FIG. 3A is attached.
Figure 3C:
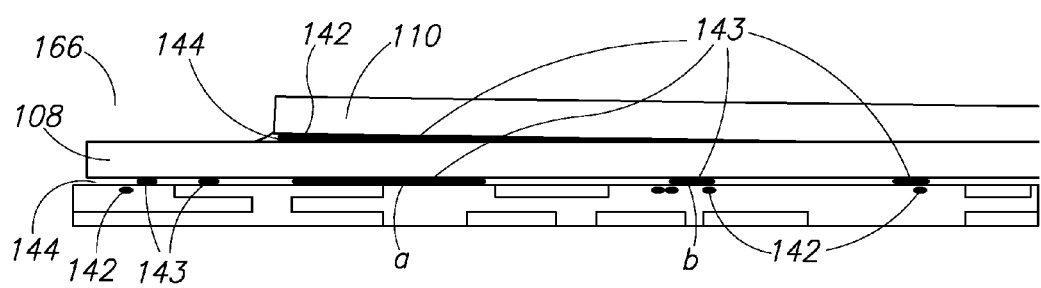
FIG. 3C is derived from an actual electron micrograph showing a cross-sectional view, along cut lines shown in FIG. 3B, of the failed bridge die stack depicted in FIG. 3A, following thermal processing.

FIGS. 3A-3C illustrate a delamination failure mode that can occur when the bridge die stack 100 is mounted on the PCB, equipped with the conventional top metal layer 120 that includes the metal plate 122. FIG. 3A shows the mechanism of such a delamination failure, which can be seen in greater detail in the cross-sectional micrograph shown in FIG. 3C. FIG. 3B is a top plan view of the top metal layer 120 showing outlines of the base chips 106 and 110 of the bridge die stack 100.

With reference to FIGS. 3A and 3C, it is shown that, during the die attach process that is used to assemble the bridge die stack 100, heat applied to the DAF to bond the dice together causes thermal expansion of the top metal layer 120. A thermally deformed top metal layer 120 exhibiting a bulge 140 can then exert an upward force 141 on the bridge die stack 100, inducing microscopic voids 142, as shown in FIG. 3C. Multiple voids 142 lead to cracks 143 in the DAF, eventually causing the die stack 100 to delaminate. Gaps 144 then form where the DAF 112 has separated from the upper surfaces of the base chips 106 and 110. By mapping the voids 142, for example, those observed to form at locations a and b indicated on FIG. 3B, the present inventors have deduced that thermal deformation of the top metal layer 120 is aggravated by the presence of the metal plate 122, which coincides with the points a and b shown in FIG. 3B, and that if the metal plate 122 were replaced with a feature that contained less bulk metal, such catastrophic delamination events could be avoided.

Figure 4A:
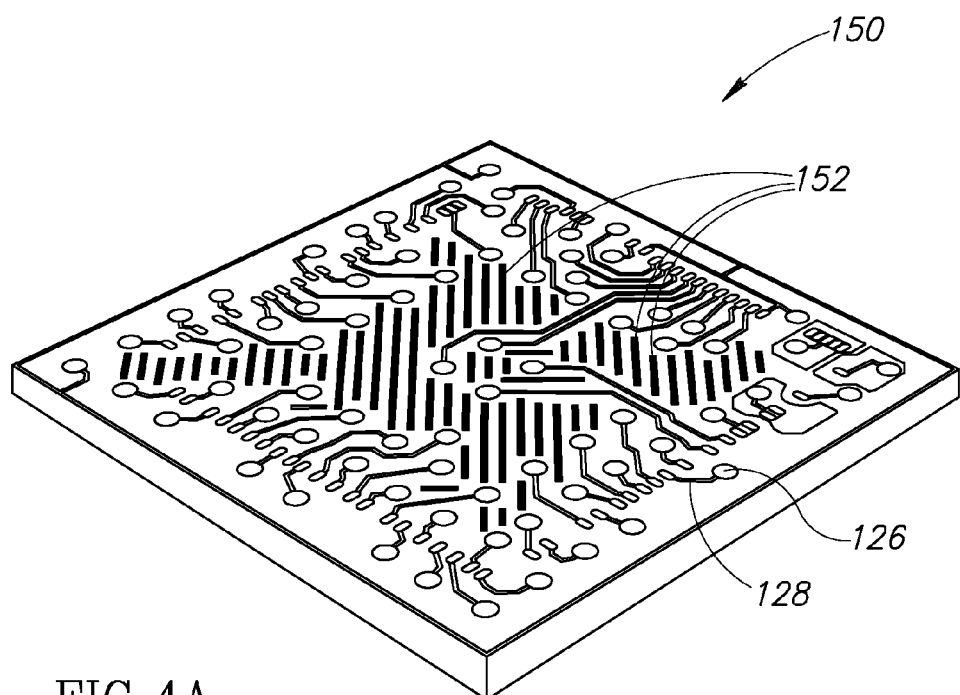
FIG. 4A is a pictorial perspective view of a region of a PCB in which the top metal layer includes a metal trace support structure, according to an embodiment described herein.
Figure 4B:
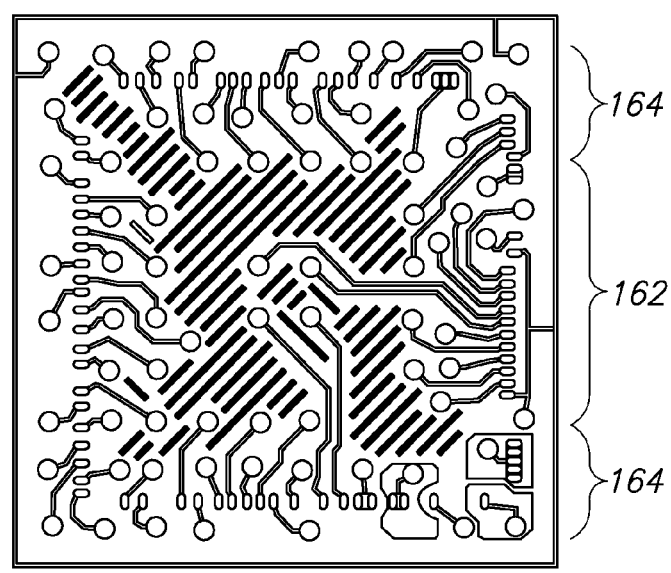
FIG. 4B shows a top plan view of the same region of the PCB shown in FIG. 4A.

FIGS. 4A and 4B show two views of an exemplary embodiment of an inventive top metal layer 150, as described herein. The top metal layer 150 is designed to prevent delamination of stacked arrangements of integrated circuit dies and, in particular, to prevent delamination of the exemplary bridge die stack 100. The top metal layer 150 includes various patterned metal features including a field 162 of equally spaced apart metal traces 152, surrounded by the individual trace features 126 coupled to the bond pads 128. Because the metal traces 152 act only as structural supports, they are generally physically and electrically isolated from one another and from the rest of the top metal layer 150. Thus, the metal traces 152 do not provide signal paths to the top metal layer 150. In one embodiment, the metal traces 152 are linear and substantially parallel along their entire length. The pattern of metal traces 152 covers approximately 5-10% of the surface area of the top metal layer 150. In one embodiment, the field 162 is about 5×5 mm$^2$, and the metal traces 152 are spaced apart by a distance of about 50 μm, and have a metal thickness of about 0.6 mm. Alternatively, the metal traces 152 can take on other dimensions and/or other design shapes such as circles, polygons, V-shaped features, and the like. The metal traces 152 are typically made of copper, but they can be made of any suitable conducting material. In one embodiment, the top metal layer 150 is covered with a thin solder mask resist layer. Openings in the solder mask resist layer allow coupling the PCB to contacts on the underside of the base dies 106 and 110.

The main purpose of the metal traces 152 is similar to that of the metal plate 122. The metal traces 152 are designed to adhere, via the DAF, to portions of the underside of the base chips, e.g., 106 and 110, that are not patterned with solder balls or contact pads. For example, in the embodiment shown in the Figures, when contacts are arranged in a grid array, e.g., a BGA or LGA, around the periphery of the underside of the base die, then the metal traces 152 will align to the center of the base die, while the contact pads 128 of individual trace features 126 underneath the periphery of the die provide connection points to the grid array. In alternative embodiments, when contacts are arranged in a grid array that is located in a central region of the underside of the base die, the metal traces 152 will be formed in the area around the periphery of the die footprint, framing the grid array for attachment, via the DAF, to the edges of the top metal layer 150. Meanwhile, individual trace features 126 outside the die footprint provide additional connection points to which bond wires 114 and 115 can be soldered.

Unlike the metal plate 122, the metal traces 152 do not provide a substantial contiguous thermal mass that causes delamination of the bridge die stack 100. Because the metal traces are thin and spaced apart from one another, they provide stress relief during processing. Because the metal traces 152 are surrounded by air, they dissipate heat quickly. Yet, the field of metal traces 152 collectively still provides adequate structural support for the bridge die stack 100.

The individual trace features 126 having contact pads 128 that are located primarily in peripheral regions 164 provide electrical connection points for the LGA contact pads on the underside of the base chips. Likewise, individual trace features 126 that are located outside the footprint of the base chips 106 and 110 provide connection points to which bond wires 114 and 115 can be soldered. Unlike the individual trace features 126, the metal traces 152 do not necessarily offer contacts for receiving solder connections. Thus, the metal traces 152 generally are not designed to function as electrical connections as described herein, although the metal traces 152 could be adapted to do so in certain embodiments.

Figure 5:
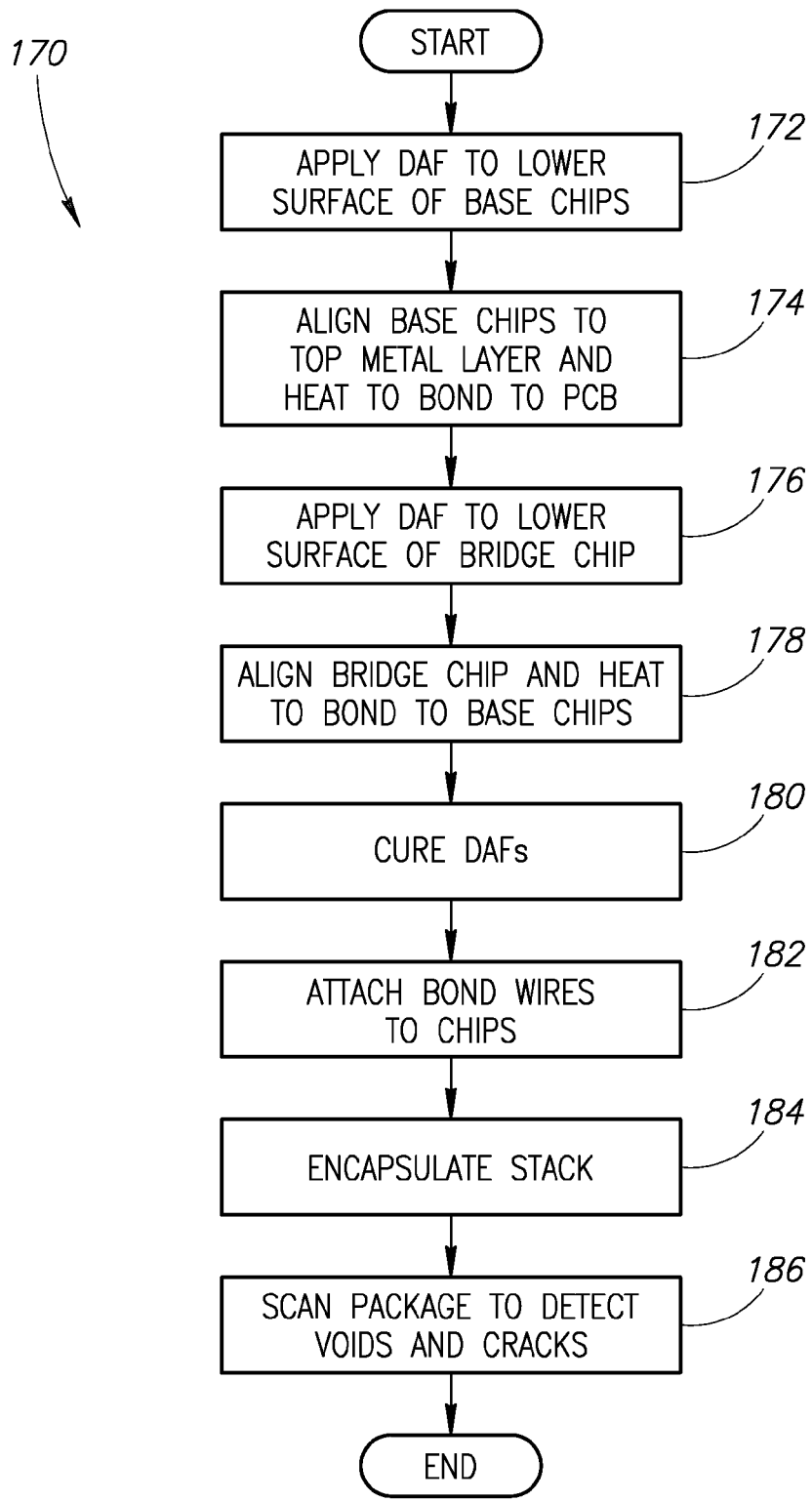
FIG. 5 is a flow diagram summarizing a die attach processing sequence in which a bridge die stack is bonded and attached to a PCB, according to one exemplary embodiment described herein.
Figure 6A:
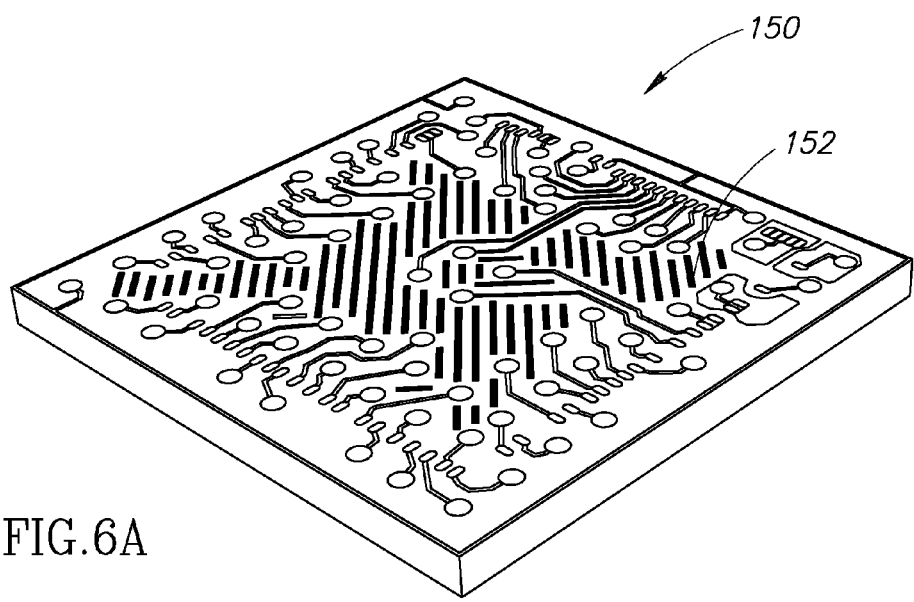
FIGS. 6A-6C are pictorial perspective views of the PCB and the die stack at various points during the die attach sequence shown in FIG. 5.
Figure 6B:
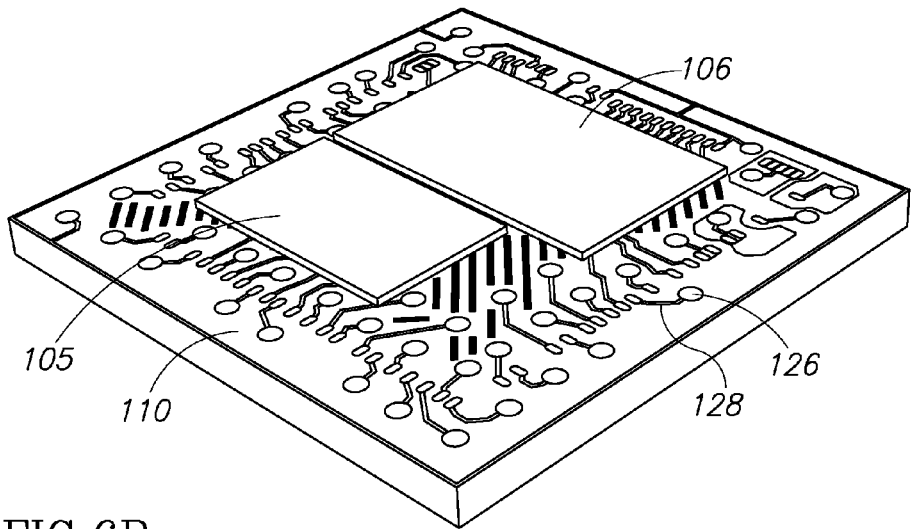
Figure 6C:
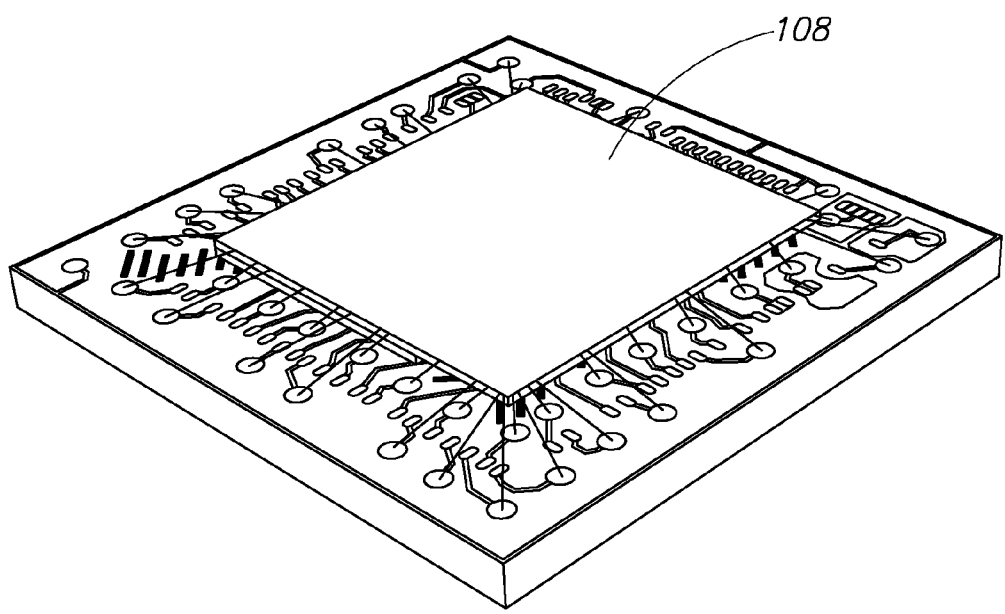

FIG. 5 describes generalized steps in an exemplary fabrication method 170 in which the bridge die stack 100 is attached to the PCB one layer at a time as shown in FIGS. 6A-6C. The PCB with the top metal layer 150 is shown in FIG. 6A prior to attaching the stacked dice. FIG. 6B shows the top metal layer 150 onto which the base chips 106 and 110 are mounted using the DAF 112. In FIG. 6C, the bridge die 108 is shown in place, covering the base chips 106 and 110. The die attach process entails heating the surface of the DAF 112 so as to melt the DAF 112 and cross-link the die attach film at the interface of the DAF 112 and the various die surfaces.

At 172, a rigid adhesive layer about 20-30 μm thick, e.g., the DAF 112, is applied to lower surfaces of each one of the base chips 106 and 110, for example, the digital die and the interposer respectively. The DAF is applied so as to adhere to lower surface areas that do not correspond to solder balls or contact pads. At 174, the base chips 106 and 110 are positioned, adjacent to one another, with respect to the substrate 102, so as to align the DAFs with the fields of metal traces 152 of the top metal layer 150. The fields of metal traces 152 are laid out so that the base chips 106 and 110 are spaced apart by the gap 107. Contacts, e.g., solder balls or contact pads located on the undersides of one or more of the base chips 106 and 110, are aligned with certain ones of the contact pads 128. The substrate 102 is then heated to a temperature of about 120 C, and then the surface of the DAF 112 is heated so as to melt the DAF 112 and cross-link the die attach film at the interface of the DAF 112 with the die surface and the top surface of the PCB.

At 176, the DAF is applied to a lower surface of the bridge chip 108.

At 178, the bridge chip 108 is aligned to the base chips 106 and 110 and the bridge stack 100 is heated to bond the dice together.

Instead of attaching the dies to the PCB one layer at a time, in an alternative embodiment, the dice can be stacked first and then the die stack 100 can be attached to a PCB equipped with the top metal layer 150 that includes metal traces 152.

Figure 7A:
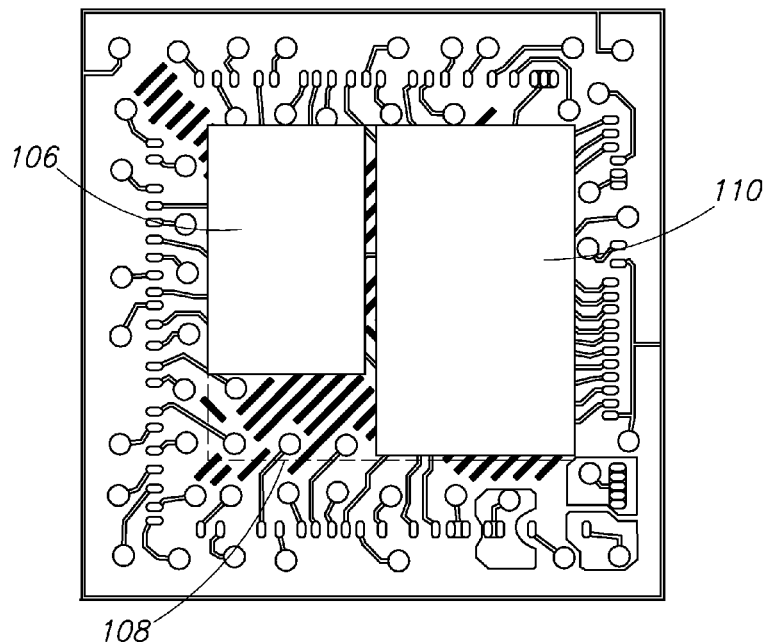
FIG. 7A is a top plan view of the inventive top metal layer of the PCB to which the bridge die stack shown in FIG. 1 is attached.

At 180, following the die attach process, the DAFs 112 are cured, for example, by heating the die stack to a temperature of about 170 C for 1 hour. Unlike the metal plate 122, the metal traces 152 are able to conduct heat during the die attach process and the cure process, while retaining their normal shape without bulging. Thus, delamination of the die stack is averted, as is demonstrated in the micrographs shown in FIGS. 7A and 7B.

At 182, bond wires 114 are attached along the perimeters of the various dies to electrically couple the integrated circuits on the dies to one another and to the PCB at the contact pads 128.

At 184, the package is encapsulated, or sealed, using a molding compound.

At 186, a sample, e.g., 1-2%, of the completed packages can be scanned to look for voids and cracks.

Figure 7B:
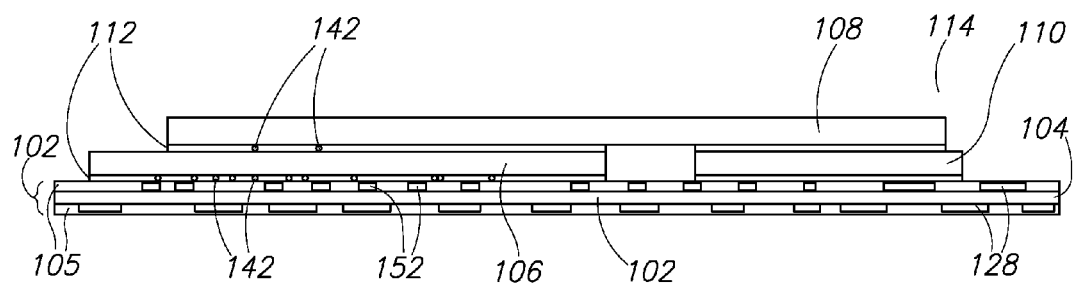
FIG. 7B is derived from an actual electron micrograph showing a cross-sectional view, along cut lines shown in FIG. 7A, of a robust bridge die stack supported by metal traces following thermal processing.

FIG. 7B shows the completed electronic package containing the bridge die stack 100, following electrical and environmental reliability testing. Following 500 temperature cycles in which the package is exposed to temperatures ranging between 55 and 125 C, the bridge die stack 100 remains intact and none of the adhesives have delaminated. Although some isolated voids 142 are seen in the DAF, no cracks 143 or gaps 144 have developed between the dice, and the DAF bonds remain intact in spite of the voids 142.

Figure 8A:
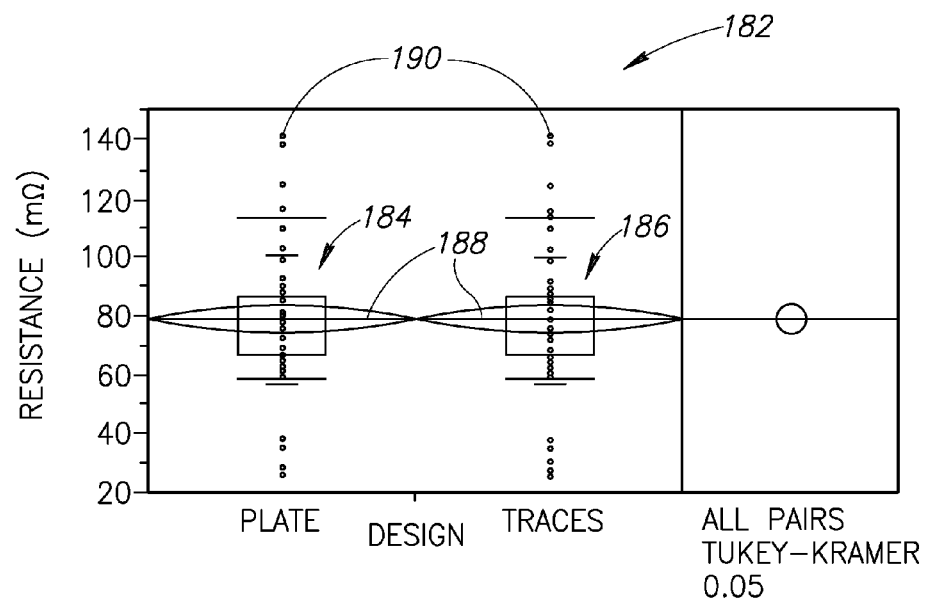
FIGS. 8A-8C are plots of statistical distributions of simulation data that confirm electrical integrity of the bridge die stack supported by metal traces, following thermal processing.
Figure 8B:
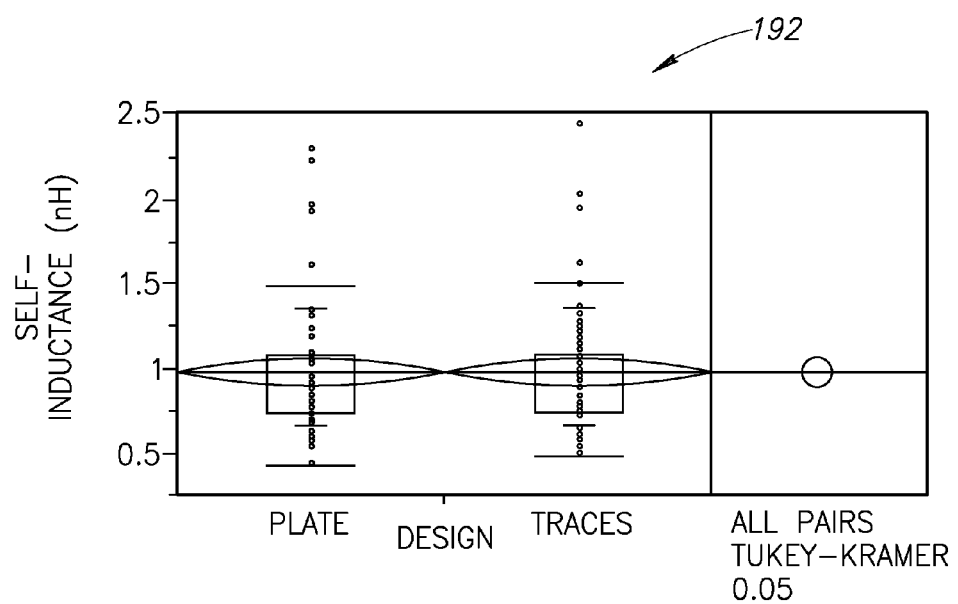
Figure 8C:
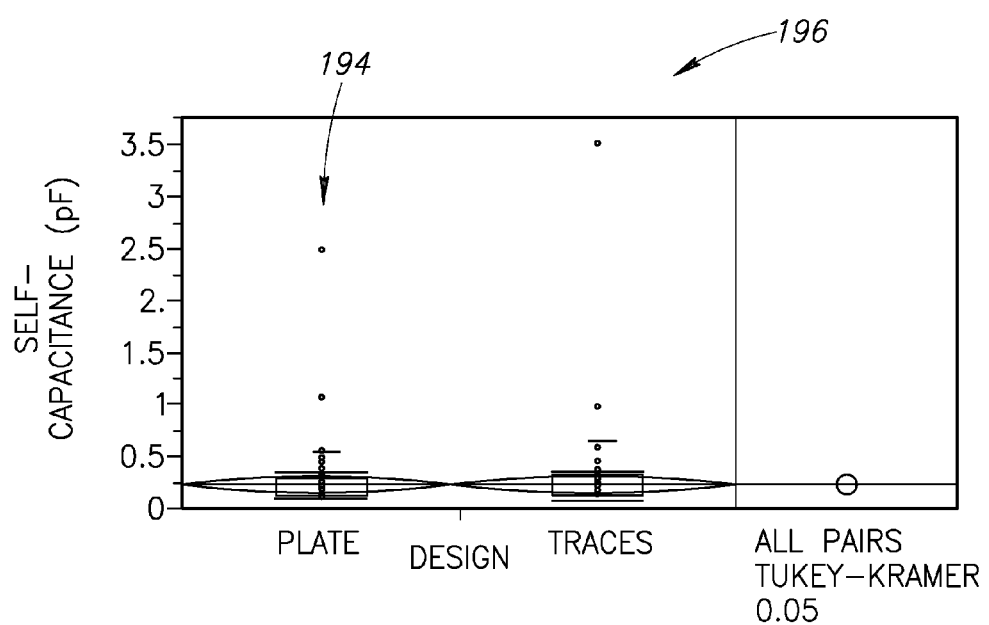

FIGS. 8A-8C show simulated statistical electrical test data for a non-delaminated bridge die stack mounted on the metal plate 122, directly compared with a bridge die stack that is supported by the metal traces 152. The electrical measurements are checked through software electrical modelling and simulation at the design stage to confirm that the use of the metal traces as a support structure is not detrimental to the electrical functionality of the dies. To gather the electrical data, electrical properties such as resistance (FIG. 8A), inductance (FIG. 8B), and capacitance (FIG. 8C) were extracted from signal connections via the individual trace features 126 and the bond wires 114. For example, FIG. 8A shows a statistical comparison 182 of a first distribution 184 of resistance data associated with a bridge die stack supported by a metal plate 122 side-by-side with a second distribution 186 of resistance data associated with a bridge die stack supported by the metal traces 152. The two distributions 184 and 186 are very similar, both having a statistical means 188 of about 80 mΩ with most of the data (mean±1σ) lying within the range of about 65-85 mΩ, and in each case, a few outliers 190 extending out as high as about 140 mΩ. A standard Tukey-Kramer test demonstrates approximate statistical equivalence of the two distributions. A similar situation is shown in FIG. 8B in which a statistical comparison of self-inductance data 192 again demonstrates substantially equivalent electrical function. FIG. 8C shows two distributions, 194 and 196, representing self-capacitance measurements associated with a die stack supported by a metal plate and the metal traces, respectively. The distributions 194 and 196 are also roughly equivalent, although both distributions are tighter, having fewer outliers, than the resistance and inductance distributions shown in FIGS. 8A and 8B.

The electrical simulation data described above confirm that the electrical resistance, inductance and capacitance of the circuitry within each bridge die stack is statistically equivalent for both support structure designs. Thus, it is understood that the electrical function of the bridge die stack 152 is not compromised by the use of the metal trace support structure, which is much more robust to delamination.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
    a printed circuit board including an embedded interconnect structure having a top metal layer;
    a metal trace support structure formed on an exposed top surface of the printed circuit board, the support structure including a plurality of metal trace lines that are equally spaced apart from each other in a regular pattern and substantially parallel to each other along their entire length, the plurality of metal trace lines being in exposed contact with air for substantially their entire length and electrically isolated from any electrical signal so as not to provide a signal path;
    a plurality of integrated circuit dies attached to the printed circuit board and overlying the metal trace support structure; and
    bond wires coupling the integrated circuit dies to one another.

2. The device of claim 1 wherein the metal trace support structure extends across an area comparable to a lower surface area of the plurality of integrated circuit dies.

3. The device of claim 1 wherein the plurality of integrated circuit dies is electrically coupled to the embedded interconnect structure by a ball grid array on a lower surface of a base die.

4. The device of claim 1 wherein the plurality of integrated circuit dies is electrically coupled to the embedded interconnect structure by a land grid array on a lower surface of a base die.

5. The device of claim 1 wherein the plurality of microelectronic dies includes an interposer.

6. The device of claim 1 wherein the plurality of microelectronic dies is arranged as a bridge stack.

7. The device of claim 1 wherein the metal trace support structure is covered with a solder mask resist layer.

8. The device of claim 1 wherein the bond wires coupling the microelectronic dies to one another form direct electrical connections between the dies.

9. The device of claim 1 wherein the bond wires coupling the microelectronic dies to one another form indirect electrical connections via signal paths within the embedded interconnect structure.

10. A top metal layer on a printed circuit board, the top metal layer comprising:
    individual trace features having rounded ends that provide contact pads electrically coupleable to a grid array, the individual trace features substantially located around a periphery of the printed circuit board;
    individual trace features having rounded ends that provide contact pads electrically coupleable to bond wires, the individual trace features substantially located around the periphery of the printed circuit board; and
    a plurality of equally-spaced metal traces, the traces being electrically isolated and forming a support structure substantially located in a central region of the printed circuit board.

11. The top metal layer of claim 10 wherein the plurality of metal traces are linear and substantially parallel along their entire length.

12. The top metal layer of claim 10 wherein the plurality of metal traces occupies a substantial portion of the area underneath the base chips.

13. The device of claim 1 wherein the microelectronic dies are in a side-by-side arrangement.

14. The device of claim 1 wherein the microelectronic dies are in a stacked arrangement.

* * * * *